(12) United States Patent
Baek et al.

(10) Patent No.: US 10,701,806 B2
(45) Date of Patent: Jun. 30, 2020

(54) PRINTED CIRCUIT BOARD INCLUDING SUB-CIRCUIT BOARD

(71) Applicant: Samsung Electro-Mechanics Co., Ltd., Suwon-si (KR)

(72) Inventors: Yong-Ho Baek, Seoul (KR); Jung-Hyun Cho, Busan (KR); Seung-Yeop Kook, Busan (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 0 days.

(21) Appl. No.: 16/587,169

(22) Filed: Sep. 30, 2019

(65) Prior Publication Data

US 2020/0029435 A1  Jan. 23, 2020

Related U.S. Application Data (63) Continuation of application No. 15/400,606, filed on Jan. 6, 2017, now Pat. No. 10,477,683.

(30) Foreign Application Priority Data

Jan. 8, 2016  (KR) .................. 10-2016-0002884
Apr. 21, 2016  (KR) .................. 10-2016-0048927

(51) Int. Cl.
| | | |
|---|---|---|
| H05K 1/14 | (2006.01) | |
| H01L 23/495 | (2006.01) | |
| H05K 3/46 | (2006.01) | |
| H01L 23/498 | (2006.01) | |
| H01L 21/48 | (2006.01) | |
| H05K 1/11 | (2006.01) | |

(Continued)

(52) U.S. Cl.
CPC ............ *H05K 1/14* (2013.01); *H01L 21/4857* (2013.01); *H01L 23/49534* (2013.01); *H01L 23/49822* (2013.01); *H01L 23/49833* (2013.01); *H05K 1/111* (2013.01); *H05K 1/115* (2013.01); *H05K 3/4694* (2013.01); *H01L 21/6835* (2013.01); *H01L 23/49827* (2013.01); *H01L 23/562* (2013.01); *H01L 2221/68345* (2013.01); *H01L 2221/68359* (2013.01); *H01L 2224/16225* (2013.01); *H01L 2224/32225* (2013.01); *H01L 2224/73204* (2013.01); *H05K 2201/10674* (2013.01)

(58) Field of Classification Search
None
See application file for complete search history.

(56) References Cited

U.S. PATENT DOCUMENTS

| | | |
|---|---|---|
| 5,081,563 A | 1/1992 | Feng et al. |
| 5,310,965 A | 5/1994 | Senba et al. |
| 6,281,446 B1 | 8/2001 | Sakamoto et al. |

(Continued)

FOREIGN PATENT DOCUMENTS

| | | |
|---|---|---|
| JP | 11-317582 A | 11/1999 |
| KR | 10-2014-0081193 A | 7/2014 |

*Primary Examiner* — Daniel P Wicklund
*Assistant Examiner* — Muhammed Azam
(74) *Attorney, Agent, or Firm* — NSIP Law (57) ABSTRACT

A printed circuit board includes: a core member including a through-hole; a sub-circuit board disposed in the through-hole; a first insulating layer disposed on opposing surfaces of the core member and opposing surfaces of the sub-circuit board; and an insulating material disposed between an inner wall of the through-hole and the sub-circuit board.

18 Claims, 8 Drawing Sheets

(51) Int. Cl.
*H01L 21/683* (2006.01)
*H01L 23/00* (2006.01)

(56) References Cited

U.S. PATENT DOCUMENTS

| | | | |
|---|---|---|---|
| 8,043,506 B2 | 10/2011 | Frankin et al. | |
| 8,159,832 B2 | 4/2012 | Arslan et al. | |
| 8,177,577 B2 | 5/2012 | Takahashi | |
| 8,183,465 B2 | 5/2012 | Suzuki et al. | |
| 8,212,363 B2 | 7/2012 | Takahashi et al. | |
| 8,493,747 B2 | 7/2013 | Naganuma et al. | |
| 8,519,270 B2 | 8/2013 | Chang | |
| 8,530,755 B2 | 9/2013 | Wakita et al. | |
| 8,541,693 B2 | 9/2013 | Wakita et al. | |
| 8,613,136 B2 | 12/2013 | Tanaka et al. | |
| 8,654,539 B2 | 2/2014 | Nakanishi | |
| 8,698,278 B2 | 4/2014 | Muramatsu | |
| 8,711,572 B2 | 4/2014 | Hsu | |
| 8,754,514 B2 | 6/2014 | Yu et al. | |
| 9,391,044 B2 * | 7/2016 | Shimizu | H05K 1/187 |
| 9,474,158 B2 * | 10/2016 | Furutani | H05K 1/185 |
| 9,706,663 B2 | 7/2017 | Sakamoto et al. | |
| 9,723,729 B2 | 8/2017 | Furusawa et al. | |
| 9,736,939 B2 | 8/2017 | Cho et al. | |
| 2003/0135994 A1 | 7/2003 | Shutou et al. | |
| 2006/0012967 A1 | 1/2006 | Asai et al. | |
| 2007/0030628 A1 | 2/2007 | Yamamoto et al. | |
| 2007/0045814 A1 | 3/2007 | Yamamoto et al. | |
| 2007/0064375 A1 | 3/2007 | Urashima et al. | |
| 2007/0076392 A1 | 4/2007 | Urashima et al. | |
| 2007/0096328 A1 | 5/2007 | Takahashi et al. | |
| 2007/0263364 A1 | 11/2007 | Kawabe et al. | |
| 2007/0281394 A1 | 12/2007 | Kawabe et al. | |
| 2008/0107863 A1 | 5/2008 | Ikeda et al. | |
| 2008/0239685 A1 | 10/2008 | Kawabe et al. | |
| 2008/0247704 A1 | 10/2008 | Kodama et al. | |
| 2008/0251285 A1 | 10/2008 | Sato et al. | |
| 2008/0277150 A1 | 11/2008 | Takashima et al. | |
| 2009/0071696 A1 | 3/2009 | Yang et al. | |
| 2009/0084596 A1 | 4/2009 | Inoue et al. | |
| 2009/0205859 A1 | 8/2009 | Tanaka et al. | |
| 2010/0018758 A1 * | 1/2010 | Yoshimura | H05K 3/4608 174/256 |
| 2010/0027225 A1 | 2/2010 | Yuda et al. | |
| 2010/0180306 A1 | 7/2010 | Kim et al. | |
| 2011/0018099 A1 | 1/2011 | Muramatsu | |
| 2012/0188734 A1 | 7/2012 | Mikado et al. | |
| 2013/0048355 A1 | 2/2013 | Furuta et al. | |
| 2013/0153269 A1 | 6/2013 | Takahashi et al. | |
| 2013/0200531 A1 | 8/2013 | Myung et al. | |
| 2013/0223033 A1 | 8/2013 | Mano et al. | |
| 2013/0256001 A1 | 10/2013 | Sakai et al. | |
| 2013/0285254 A1 | 10/2013 | Kainuma et al. | |
| 2014/0054557 A1 | 2/2014 | Jung et al. | |
| 2014/0118976 A1 * | 5/2014 | Yoshikawa | H01L 23/49822 361/763 |
| 2014/0138134 A1 | 5/2014 | Imafuji et al. | |
| 2014/0321069 A1 | 10/2014 | Gouchi et al. | |
| 2015/0027758 A1 | 1/2015 | Maeda | |
| 2015/0036305 A1 | 2/2015 | Nanjo | |
| 2015/0060114 A1 | 3/2015 | Park et al. | |
| 2015/0101856 A1 | 4/2015 | Maling et al. | |
| 2015/0163919 A1 | 6/2015 | Nakagome et al. | |
| 2015/0271923 A1 | 9/2015 | Shimabe et al. | |
| 2015/0334844 A1 | 11/2015 | Shimabe et al. | |
| 2016/0113110 A1 | 4/2016 | Furusawa et al. | |
| 2016/0120033 A1 | 4/2016 | Furusawa et al. | |
| 2017/0154201 A1 | 6/2017 | Kwon et al. | |
| 2017/0202083 A1 | 7/2017 | Baek et al. | |

* cited by examiner

PRINTED CIRCUIT BOARD INCLUDING SUB-CIRCUIT BOARD

CROSS-REFERENCE TO RELATED APPLICATIONS

This application is a continuation of U.S. patent application Ser. No. 15/400,606 filed Jan. 6, 2017 which claims the benefit under 35 USC 119(a) of Korean Patent Application Nos. 10-2016-0048927 and 10-2016-0002884, filed on Apr. 21, 2016 and Jan. 8, 2016, respectively, in the Korean Intellectual Property Office, the entire disclosures of which are incorporated herein by reference for all purposes.

BACKGROUND

1. Field

The following description relates to a printed circuit board.

2. Description of Related Art

With the advancements in the computer industry, there have been advancements in the technology of manufacturing a die with higher performance and a lower cost. Accordingly, various printed circuit boards have been developed to install the die therein.

Particularly, for substrates used in a server, it is difficult to have a sufficient yield due to the multilayer structure and large size of the substrates. Additionally, a long lead time is required for the production of server substrates. Moreover, server substrates require multiple layers of via structure, precise construction and excellent electrical properties.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes: a core member including a through-hole; a sub-circuit board disposed in the through-hole; a first insulating layer disposed on opposing surfaces of the core member and opposing surfaces of the sub-circuit board; and an insulating material disposed between an inner wall of the through-hole and the sub-circuit board.

The printed circuit board may further include a via extending through the core member.

The sub-circuit board may include a circuit layer and a second insulating layer.

The insulating material may be made of a material different from a material of the second insulating layer.

The insulating material may be filled with a material of the first insulating layer.

The first insulating layer may further include fabric stiffener.

The sub-circuit board may include a coreless structure.

The sub-circuit board may include a reinforcing layer including fabric stiffener.

The sub-circuit board may include: a high density circuit; and a low density circuit formed on one or both of the core member and the first insulating layer, and having a density lower than a density of the high density circuit.

The high density circuit may include stacked vias arranged symmetrically with one another.

The printed circuit board may further include a via or a solder bump connecting the low density circuit with the high density circuit.

A distance between circuit layers of the high density circuit may be less than a distance between circuit layers of the low density circuit.

A width of the high density circuit may be less than a width of the low density circuit.

The printed circuit board may further include an electronic device connected to the high density circuit and encapsulated in the first insulating layer.

The printed circuit board may further include an outer layer circuit including a connection pad and a circuit pattern, wherein the connection pad is formed on the first insulating layer and the circuit pattern connects the high density circuit to the connection pad.

The low density circuit layer may include low density circuit layers disposed on the core member and the sub-circuit board.

The first insulating layer may be laminated on the opposing surfaces of the core member and the opposing surfaces of the sub-circuit board.

In another general aspect, a printed circuit board includes: a first circuit board including a first circuit; and a second circuit board embedded in the first circuit board between insulators, wherein the second circuit board includes a second circuit connected to the first circuit, and wherein the second circuit includes a circuit pattern density that is higher than a circuit pattern density of the first circuit.

The insulators may include: a laminated insulating layer disposed on opposing surfaces of the core member and opposing surfaces of the sub-circuit board; and an insulating material disposed between the first circuit board and the second circuit board.

The second circuit may include a circuit layer disposed in a coreless insulating material.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1:
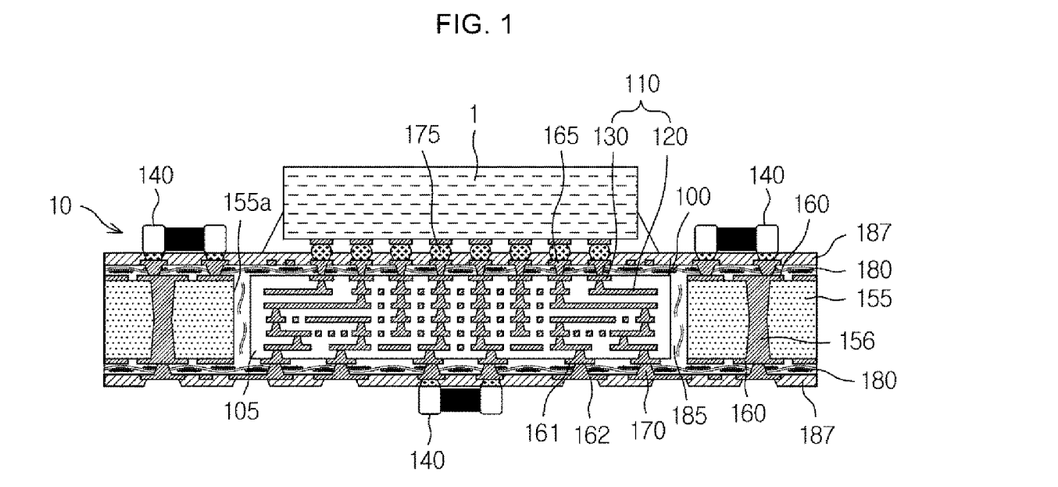
FIG. 1 illustrates an example of a printed circuit board connected to a die.

FIG. 1 illustrates an example of a printed circuit board 10. Referring to FIG. 1, the printed circuit board 10 includes a sub-circuit board 100, a core member 155, a first insulating layer 180 and an insulating material 185.

The sub-circuit board 100 is another circuit board encapsulated in the printed circuit board 10 and includes at least one circuit layer and a second insulating layer 105 configured to insulate the at least one circuit layer from other layers and/or components. The at least one circuit layer is, for example, embedded in second insulating layer 105. The sub-circuit board 100 may perform a particular function that is not processed by any other region of the printed circuit board 10. For example, the sub-circuit board 100 is electrically connected to a die 1 installed on the printed circuit board 10 to perform, for example, a transfer of an electric signal. In the example described herein, the die 1 is an integrated circuit. The sub-circuit board 100 includes a high density circuit 110 including a fine circuit pattern 120. The high density circuit 110 is highly concentrated in a small space in order to be connected to the die 1.

In the sub-circuit board 100, a width and an inter-circuit distance of the high density circuit 110 may be less than a width and an inter-circuit distance, respectively, of a low density circuit 160, which will be described later. Moreover, the high density circuit 110 may be formed to be finer than an outer circuit layer 165, which is formed on an outer layer of the sub-circuit board 100 after the sub-circuit board 100 is encapsulated. For example, the high density circuit 110 is formed using, a semiconductor process, and the low density circuit 160 is formed through a semi-additive process (SAP), a modified semi-additive process (M-SAP) or a tenting process. Alternatively, the high density circuit 110 may be formed using the SAP, which is a relatively more precise substrate process, and the low density circuit 160 may be formed using the M-SAP or the tenting process, which is a relatively less precise substrate process.

The sub-circuit board 100 may be formed in a coreless structure, that is, a structure having no reinforcing member in the middle of the sub-circuit board 100. For example, the sub-circuit board 100 is formed by successively laminating layers of the fine circuit pattern 120 and the second insulating layer 105 for insulating the fine circuit pattern 120, without any reinforcing member in the middle of the layers of the fine circuit pattern 120 and the second insulating layer 105. In order to prevent the coreless structure of sub-circuit board 100 from warping due to physical forces or environmental temperature changes, for example, a reinforcing layer having fabric stiffener included in the reinforcing layer may be added to the sub-circuit board 100. For example, a prepreg layer is additionally laminated on a circuit layer that is built up with the fine circuit pattern 120 and the second insulating layer.

The sub-circuit board 100 includes a pad 130 formed on one surface of the sub-circuit board 100. Although not shown in the example of FIG. 1, the die 1 may be directly coupled to the pad 130, such that the sub-circuit board 100 may be directly connected with the die 1. The one surface of the sub-circuit board 100 on which the pad 130 is formed may be an outer layer of the printed circuit board 10.

Alternatively, as illustrated in FIG. 1, the sub-circuit board 100 may include an outer layer formed on the one surface of the sub-circuit board 100 on which the pad 130 is formed, and the outer circuit layer 165 for connecting the die 1 with the high density circuit 110 may be formed on the outer layer of the sub-circuit board 100. As illustrated in FIG. 1, the outer circuit layer 165 includes a pad for connection with the die 1 and is connected with the pad 130 of the high density circuit 110. The outer circuit layer 165 may be directly soldered on the high density circuit 110 to prevent damage to the high density circuit 110.

In an example, the outer circuit layer 165 includes a fan-out circuit pattern for fanning out the high density circuit 110. That is, the circuit pattern of the high density circuit 110 of the sub-circuit board 100 may be spread out and dispersed by being connected to the lower density fan-out circuit pattern of the outer circuit layer 165. The fan-out circuit pattern may include a pad formed on the outer layer of the printed circuit board in accordance with the dimensions of the die 1. Accordingly, the high density circuit 110 may be designed free of the dimensions of the die 1, thereby providing a higher freedom of design of the high density circuit 110.

Figure 2:
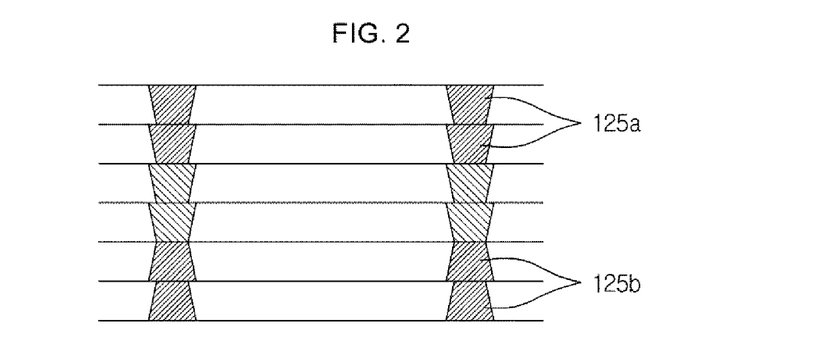
FIG. 2 illustrates a via structure in a high density circuit of an example of a printed circuit board.

FIG. 2 illustrates a via structure in the high density circuit 110. Referring to FIG. 2, the high density circuit 110 includes stacked vias 125a, 125b, which are laminated or disposed to be symmetrical to each other. In order to minimize warpage of the sub-circuit board 100, the vias 125a, 125b may be laminated symmetrically about a center portion of the sub-circuit board 100. A few via layers may be initially laminated on one side only, and then remaining via layers may be successively laminated on either side to form the symmetrical structure of stacked vias 125a, 125b. In an example in which the vias 125a, 125b are laminated in the high density circuit 110, the vias 125a, 125b are included in a structure formed of layers of cloth or paper with a thermoset resin that are cured under pressure and temperature. As illustrated in FIG. 2, the vias 125a may be disposed in an upper portion of the sub-circuit board 100, and may have a width that increases from a bottom of the vias 125a to a top of the vias 125a. As also illustrated in FIG. 2, the vias 125b may be disposed in a lower portion of the sub-circuit board 100, and may have a width that decreases from a bottom of the vias 125b to a top of the vias 125b.

Referring to FIG. 1, the core member 155 forms a center portion of the printed circuit board 10, and works with a first insulating layer 180 disposed on opposite surfaces (for example, upper and lower surfaces) of the core member 155 to resist or prevent warpage of the sub-circuit board 100. For example, to provide warpage resistance, the core member 155 is made of a material having a higher rigidity than a rigidity of the sub-circuit board 100 and the first insulating layer 180, and a through-hole C (FIG. 6) is formed in the core member 155 to accommodate the sub-circuit board 100 in the through-hole C.

For example, the core member 155 is an insulating substrate having a reinforcing material, such as glass fiber or carbon fiber, impregnated in an insulating resin or is a metal core made of a metallic material. However, the core member 155 may be made of a variety of other materials. Moreover, the core member 155 is penetrated by a via 156. The via 156 provides an electrical connection to the upper and lower surfaces of the core member 155. Referring to FIG. 1, the low density circuits 160 formed on the upper surface and the lower surface of the core member 155 are connected to each other through the via 156.

By having the sub-circuit board 100 encapsulated in the core member 155, a region in which the sub-circuit board 100 is encapsulated may not need to have a thick core structure. Accordingly, the via 156 is not disposed in the region of the core member 155 in which the sub-circuit board 100 is encapsulated. Due to the processing restrictions, the via 156 cannot be formed in a small distance. Therefore, by omitting a via, such as the via 156, which penetrates entirely through the core member 155 in the region of the core member 155 in which the sub-circuit board 100 is encapsulated, and substituting such via penetrating the core member 155 with the stacked vias 125a, 125b of the sub-circuit board 100, it is possible to have a fine pitch between the vias 125a, 125b. Moreover, by having the core structure omitted at the through-hole C, it is possible to reduce double layers on an upper surface and a lower surface of the core member 155. By reducing the distance between the vias and the circuit layer on upper and lower surfaces of the core, it is possible to reduce the routing distance of the circuit and decrease the number of layers and the size of the overall substrate. Moreover, by replacing the via 156 of the core member 155 and the vias connected thereto with the stacked vias in the region in which the sub-circuit board 100 is encapsulated, it is possible to prevent a stress issue caused by a difference in the coefficient of thermal expansion between the via 156 of the core member 155 and the vias connected thereto.

The first insulating layer 180 is laminated on both (e.g., upper and lower) surfaces of the core member 155 and the sub-circuit board 100 to couple both surfaces of the sub-circuit board 100, which is disposed in the through-hole C, with the core member 155.

Referring to FIG. 1, the core member 155 is used as a middle layer of the printed circuit board, and the sub-circuit board 100 is disposed in the through-hole C. The core member 155 and the sub-circuit board 100 are coupled with each other by the first insulating layer 180. For instance, the core member 155 has the shape of a rectangular frame, and the sub-circuit board 100 is structured to be disposed and encapsulated within the rectangular frame. Due to the first insulating layer 180 being laminated on both surfaces of the core member 155 and the sub-circuit 100, the core member 155 secures the sub-circuit board 100 to prevent the warpage of the sub-circuit board 100.

The first insulating layer 180 may contain fabric stiffener, such as glass fiber. For instance, the first insulating layer 180 is formed from a laminated prepreg. The first insulating layer 180 containing the fabric stiffener further reinforces the rigidity of the sub-circuit board 100 when the sub-circuit board 100 and the core member 155 are integrally structured.

Figure 6:
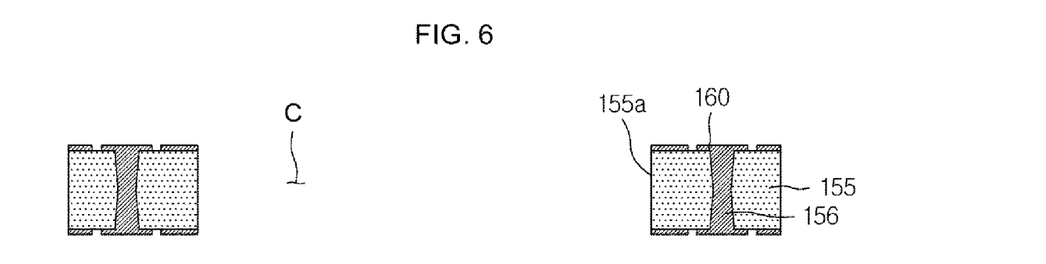

Referring to FIGS. 1 and 6, insulating material 185 is disposed between an inner wall 155a of the through-hole C and the sub-circuit board 100 to couple a side wall of sub-circuit board 100 with the core member 155. More specifically, when the sub-circuit board 100 is initially disposed in the through-hole C of the core member 155, a gap is formed between the inner wall 155a of the through-hole C and the sub-circuit board 100. The insulating material 185 fills the gap and, at the same time, couples the core member 155 with the sub-circuit board 100. Accordingly, by allowing the core member 155 to fasten the sub-circuit board 100, the insulating material 185 prevents warpage of the sub-circuit board 100.

The insulating material 185 may be made of a different material from that of the second insulating layer 105 of the sub-circuit board 100. For example, the insulating material 185 is formed by having some of the insulating material of the first insulating layer 180 filled therein. In a case where the first insulating layer 180 contains fabric stiffener, the insulating material 185 may also contain the fabric stiffener. Moreover, the insulating material 185 may be formed by filling a separate material in between the inner wall 155a of the through-hole and the sub-circuit board 100 before the first insulating layer 180 is laminated.

In a printed circuit board, areas excluding areas where a high density circuit is needed for special purposes or applications may not need to include a high density circuit. Therefore, in an embodiment, a low density circuit, which has a higher yield and is less expensive, may be disposed in areas where a high density circuit is not needed. Accordingly, the low density circuit 160, which has a lower circuit pattern density than a circuit pattern density of the high density circuit 110, is formed in a region including the core member 155 and the first insulating layer 180.

For example, the low density circuit 160 is formed at an inside or outside of one or both of the core member 155 and the first insulating layer 180. In the embodiment illustrated in FIG. 1, the low density circuit is formed between the core member 155 and the first insulating layer 180 on the upper and lower surfaces of the core member 155. Accordingly, the core member 155, the first insulating layer 180 and the low density circuit 160 integrally form a low density printed circuit area, and the printed circuit board 10 has an overall structure in which the sub-circuit board 100 containing the high density circuit 110 is encapsulated in the low density printed circuit area.

Since the sub-circuit board 100 has circuit layers having a higher circuit pattern density than a circuit pattern density of the low density printed circuit area, a distance between the circuit layers in the sub-circuit board 100 is less than a distance between the circuit layers in the low density printed circuit area. For instance, multiple circuit layers of the sub-circuit board 100 are encapsulated in a single insulating layer of the low density printed circuit area. The encapsulated sub-circuit board 100 may be covered by an outer layer of the low density printed circuit area.

Moreover, the low density printed circuit area may be formed to conform to a form factor of a server substrate. The form factor refers to the size, configuration and physical arrangement of a circuit board, such as a server substrate, having a specific purpose, and is a standard for configuring the hardware. In the printed circuit board 10, the low density printed circuit area may be formed to correspond to the form factor, and the sub-circuit board 100 may be freely formed. For example, the low density circuit board area, which corresponds to the form factor, has a layout based on the standard, and the sub-circuit board 100, which is an area outside the form factor, can be fabricated in various sizes and forms.

The low density circuit board area is provided with a space for mounting a part on the die side. For example, a first electronic device 140, such as a die side capacitor, is mounted on an outer layer 187 of the server substrate/printed circuit board 10 in the low density circuit board area. More specifically, the first electronic device 140 is connected to a circuit pattern 162 of the low density circuit 160. The outer layer 187 is, for example, a solder resist layer disposed on outer surfaces of the first insulating layer 180 at upper and lower sides of the server substrate/printed circuit board 10. The low density circuit board area may have a ground GND formed therein, and the ground may be connected to the sub-circuit board 100 through a via.

Referring to FIG. 1, the low density circuit board area further includes a via 170 or a solder bump connecting the low density circuit 160 with the high density circuit 110 of the sub-circuit board 100. In the example shown, the via 170 connects a layer of the low density circuit 160 on the lower side of the printed circuit board 10 with a layer of the high density circuit 110 on the lower side of the printed circuit board 10. The low density circuit 160 includes a pad 161 that is disposed on the lower side of the sub-circuit board 100 and a circuit pattern 162 connected to the pad. Referring to FIG. 1, the low density circuit 160 and the high density circuit 110 are directly connected to each other vertically through the via 170, which is connected to the circuit pattern 162. Accordingly, the routing distance of a signal-transferring circuit may be reduced to enhance the electrical reliability of the printed circuit board 10.

FIGS. 3 to 14 illustrate processes of an example of a method of manufacturing the printed circuit board 10. The method generally includes coupling and encapsulating the sub-circuit board 110 in a low density printed circuit board having the core member 155 provided therein.

Figure 3:
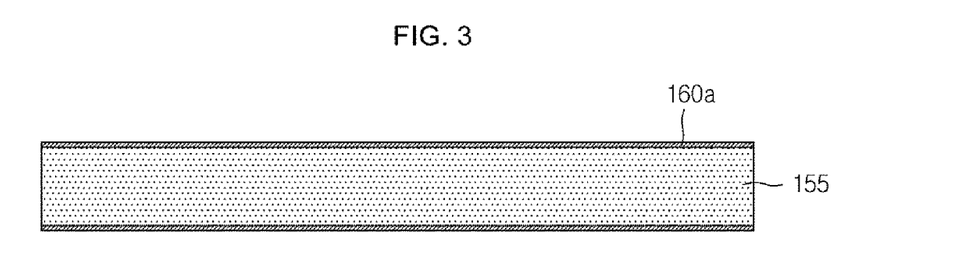
FIG. 3 to FIG. 14 illustrate an example of a method of manufacturing a printed circuit board.
Figure 4:
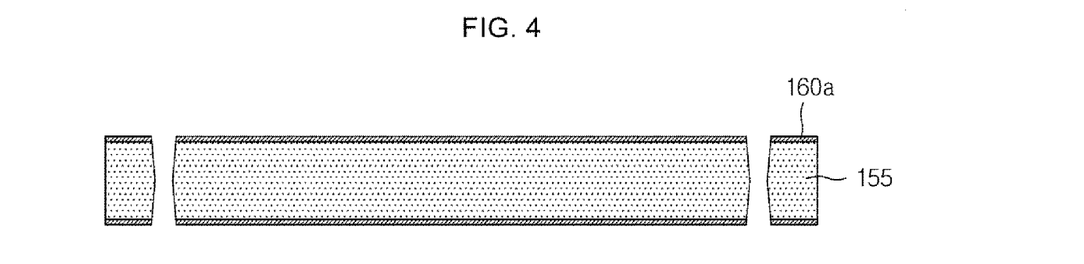
Figure 5:
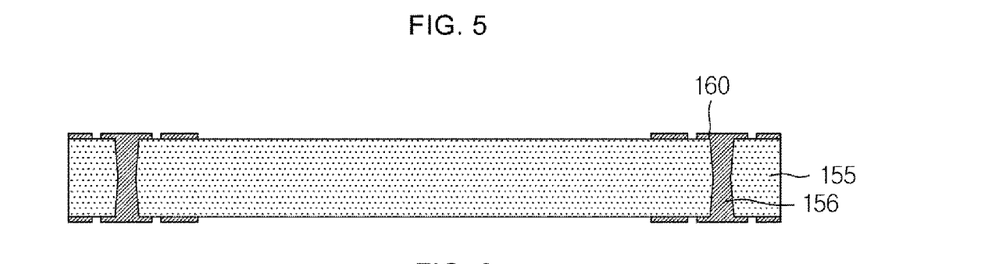

Referring to FIG. 3 to FIG. 5, the core member 155 having a metal layer 160a formed on upper and lower surfaces thereof is provided, and a portion of the low density circuit 160 including the via 156 penetrating the core member 155 is formed by removing portions of the metal layer 160a to form the pad 161, and removing additional portions of the metal layer 160a and portions of the core member 155 to form a via hole 156a and filling the via hole 156a with a conductive material. Referring to FIG. 6, a through-hole C is formed by removing corresponding portions of the metal layer 160a and the core member 155.

Figure 7:
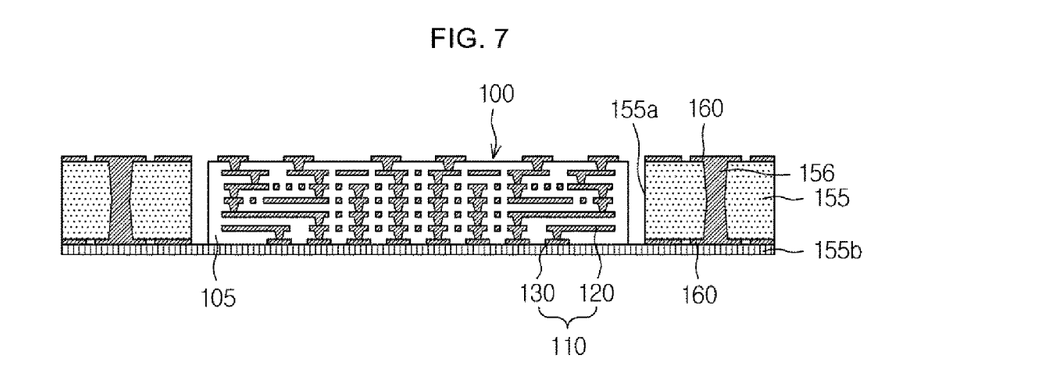

Referring to FIG. 7, the sub-circuit board 100 having a high density circuit 110 provided therein is prepared, and the sub-circuit board 100 is positioned inside the through-hole C. An adhesive tape 155b is attached on one surface of the core member 155 to secure the sub-circuit board 100 in the through-hole C.

Figure 8:
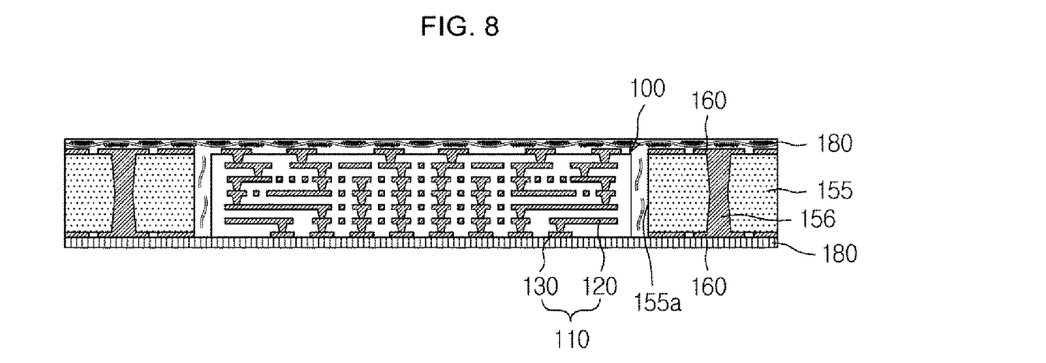

Referring to FIG. 8, the first insulating layer 180 is laminated on another surface of the core member 155 opposite the one surface on which the adhesive tape is attached, and the sub-circuit board 100 is encapsulated by filling the insulating material 185 in the gap between the inner wall 155a of the through-hole C and the sub-circuit board 100. The insulating material 185 may be formed by having some of an insulating material of the first insulating layer 180 filled in the gap between the inner wall 155a of the through-hole C and the sub-circuit board 100. The first insulating layer 180 may contain fabric stiffener, such as glass fiber.

Figure 9:
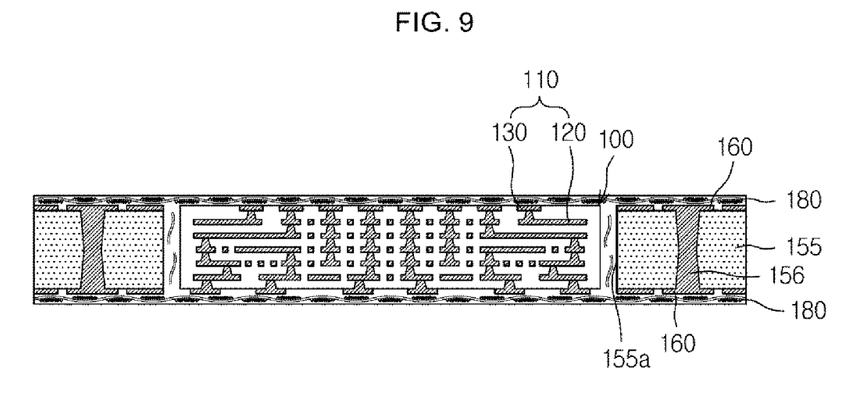

Referring to FIG. 9, the adhesive tape 155b is removed from the one surface of the core member 155, and the first insulating layer 180 is laminated on the one surface of the core member 155. As a result, both surfaces of the sub-circuit board 100 are tightly coupled with the core member 155 to prevent warpage.

Figure 10:
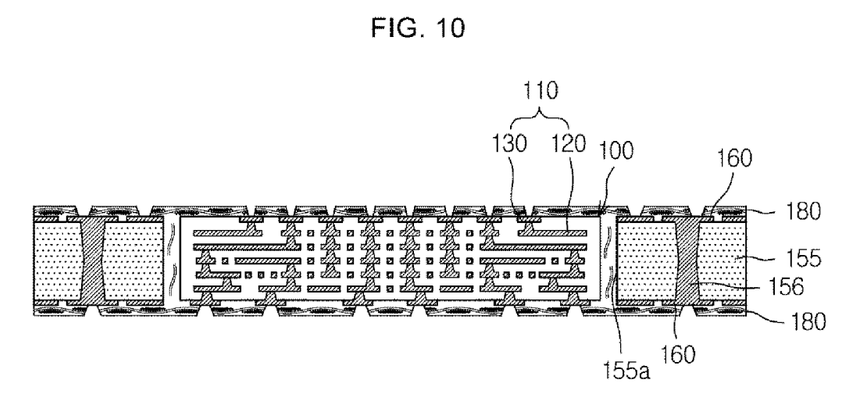
Figure 11:
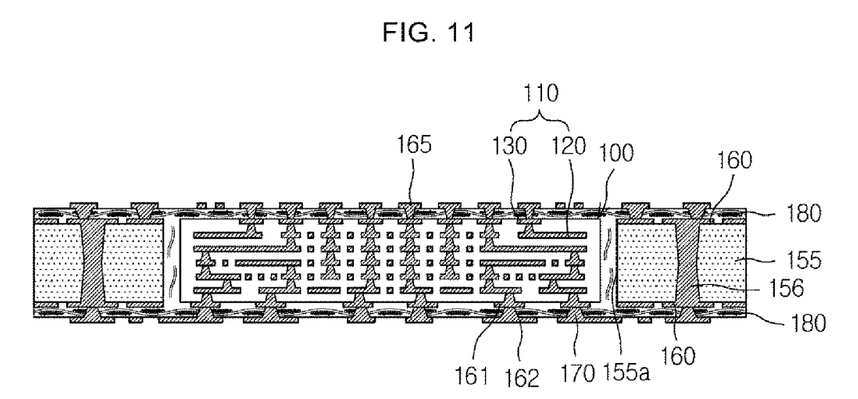
Figure 12:
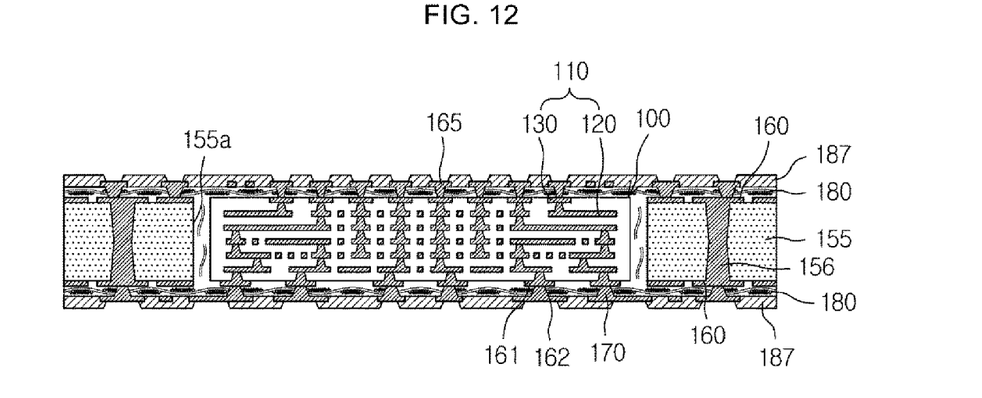

Referring to FIG. 10 and FIG. 11, the outer layer circuit 165 is formed to be connected with one surface of the sub-circuit board 100. The via 170 and the circuit pattern 162 of the low density circuit 160 connected with the via 170 is formed on the other surface of the sub-circuit board 100. Referring to FIG. 12, a solder resist layer 187 is formed as an outer layer of the printed circuit board 10, on the first insulating layer 180 on the one surface and the other surface of the core member 155.

Figure 13:
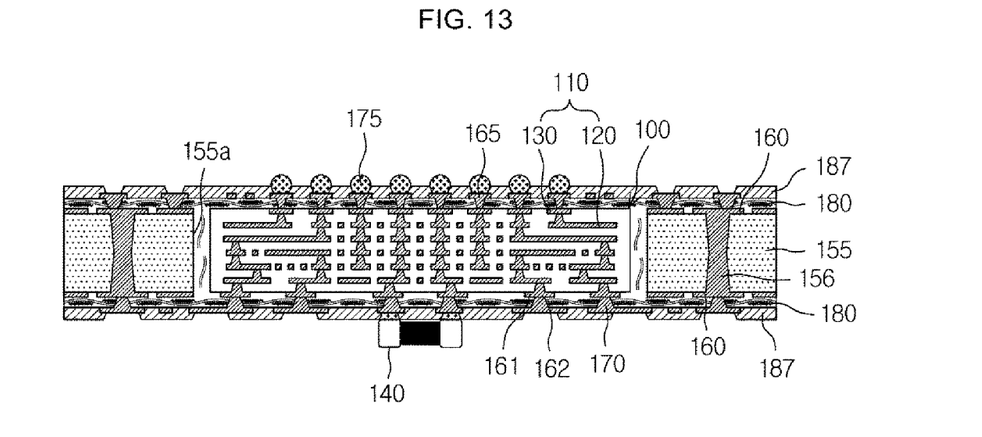
Figure 14:
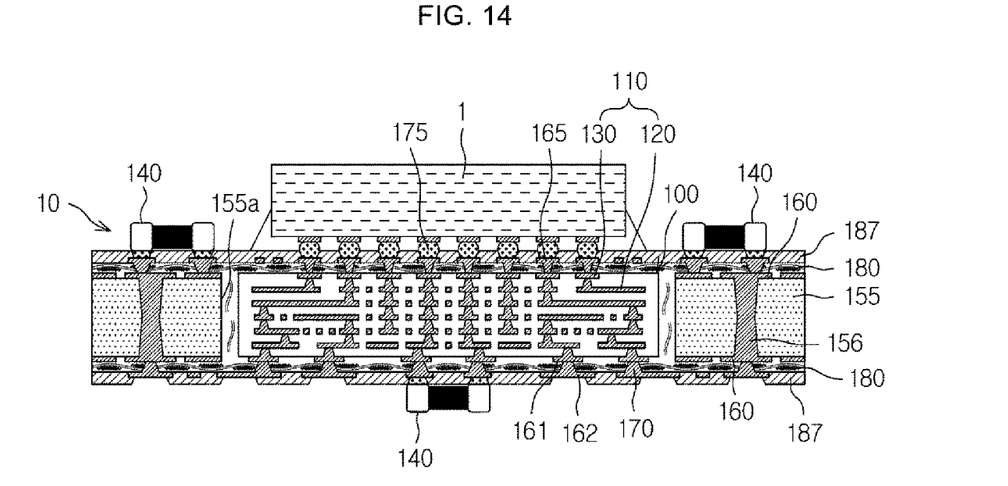

Referring to FIG. 13, the solder bump 175 is formed on the outer layer circuit 165 exposed to one surface of the printed circuit board 10 through an opening of the solder resist layer 187, and the first electronic device 140 is installed on the other surface of the printed circuit board 10. Referring to FIG. 14, the die 1 is installed on the one surface of the printed circuit board 10 and connected to the outer layer circuit 165 through the solder bump 175. Additional first electronic devices 140 are installed on the one surface of the printed circuit board 10.

Figure 15:
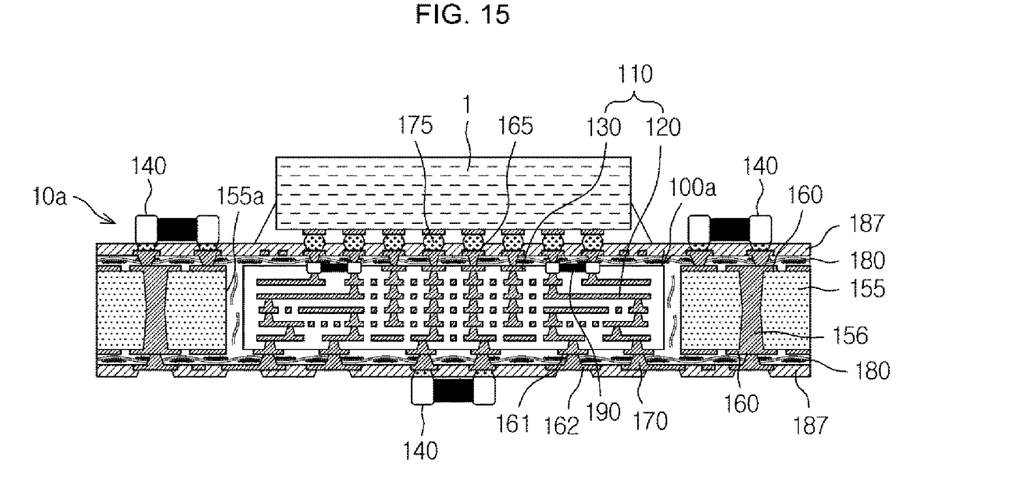
FIG. 15 illustrates another example of a printed circuit board connected to a die.

FIG. 15 illustrates yet another example of a printed circuit board 10a. The printed circuit board 10a is similar to the printed circuit board 10 of FIG. 1, except that the printed circuit board 10a includes a sub-circuit board 100a. The sub-circuit board 100a is similar to the sub-circuit board 100, except that the sub-circuit board 10a includes a second electronic device 190 that is connected to the high density circuit 110 and encapsulated in the first insulating layer 180. For example, the sub-circuit board 100a includes the second electronic device 190, which may be an active device or a passive device such as a capacitor, mounted on the outer layer of the sub-circuit board 100a. The second electronic device 190 is mounted, for example, on an upper surface of the sub-circuit board 100a. Particularly, the second electronic device 140 may be a die side capacitor, which has been conventionally mounted on an outer layer of a printed circuit board, and may be mounted on the sub-circuit board 100a and then encapsulated in the printed circuit board 10a. Moreover, in order to support the function of the die 1, the second electronic device 190 is configured to route and transfer power of a micro electronic device/system.

Figure 16:
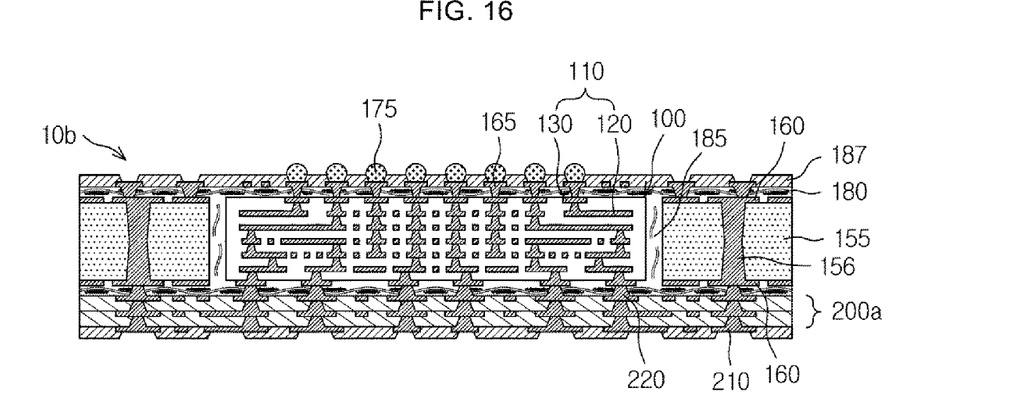
FIG. 16 illustrates yet another example of a printed circuit board.

FIG. 16 illustrates yet another example of a printed circuit board 10b. Referring to FIG. 16, the printed circuit board 10b is similar to the printed circuit board 10 of FIG. 1, but further includes multiple low density circuit layers 200a laminated on the other surface (for example, the lower surface) of the sub-circuit board 100. In other words, the printed circuit board 10b includes the printed circuit board 10 in accordance with the example of FIG. 1, without the circuit pattern 162 on the lower side thereof, as an upper substrate and the multiple low density circuit layers 200a as a lower substrate.

The multiple low density circuit layers 200a are connected so as to support the upper substrate having the sub-circuit board 100 encapsulated therein. A circuit 210 of the multiple low density circuit layers 200a is connected with the sub-circuit board 100 and the low density circuit 160 of the upper substrate through a via 220. As the multiple low density circuit layers 200a have thicker circuit and insulating layer than those of the sub-circuit board 100, the low density circuit layers 200a may have a higher rigidity than the upper substrate having the sub-circuit board 100 encapsulated therein. Accordingly, the multiple low density circuit layers 200a may function to prevent the warpage of the sub-circuit board 100 and the upper substrate.

FIGS. 17 to 26 are processes of an example of a method of manufacturing the printed circuit board 10b. The method generally includes coupling and encapsulating the sub-circuit board 100 in the core member 155 and the low density circuit board including the multiple low density circuit layers 200a provided therein.

Figure 17:
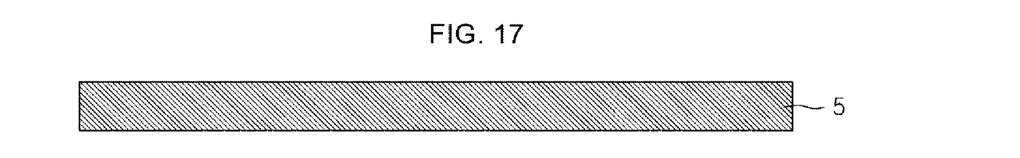
FIG. 17 to FIG. 25 illustrate another example of a method of manufacturing a printed circuit board.
Figure 18:
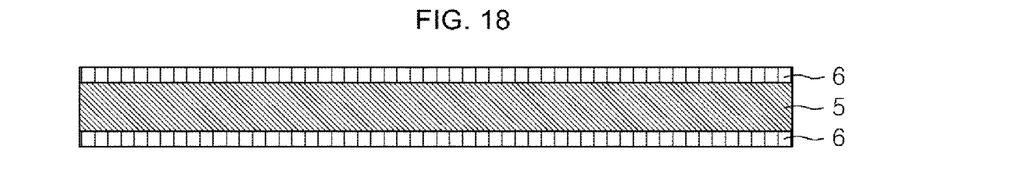
Figure 19:
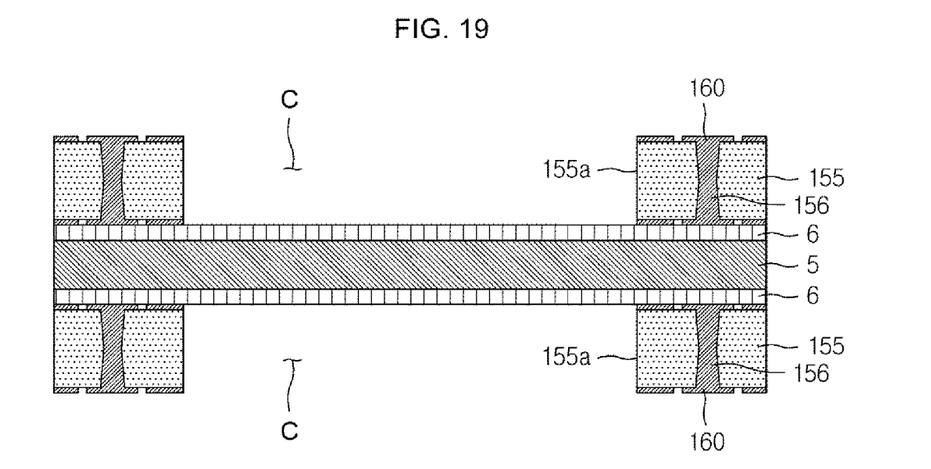

Referring to FIG. 17 and FIG. 18, a carrier 5 is prepared, and adhesive layers 6 are formed on opposite surfaces (such as upper and lower surfaces) of the carrier 5. Referring to FIG. 19, the core members 155, each having a through hole C, a portion of the low density circuit 160 and a via 156 formed therein, are attached to the opposite surfaces of the carrier 5 using the adhesive layers 6. In the following paragraphs, further operations will be described with respect to a single core member 155 attached to one surface of the carrier 5 and having the through hole C, the portion of the low density circuit 160 and the via 156 formed therein. However, it should be understood that the following operations are repeated for the additional core member 155 attached to the opposite surface of the carrier 5 and having the through hole C, the portion of the low density circuit 160 and the via 156 formed therein.

Figure 20:
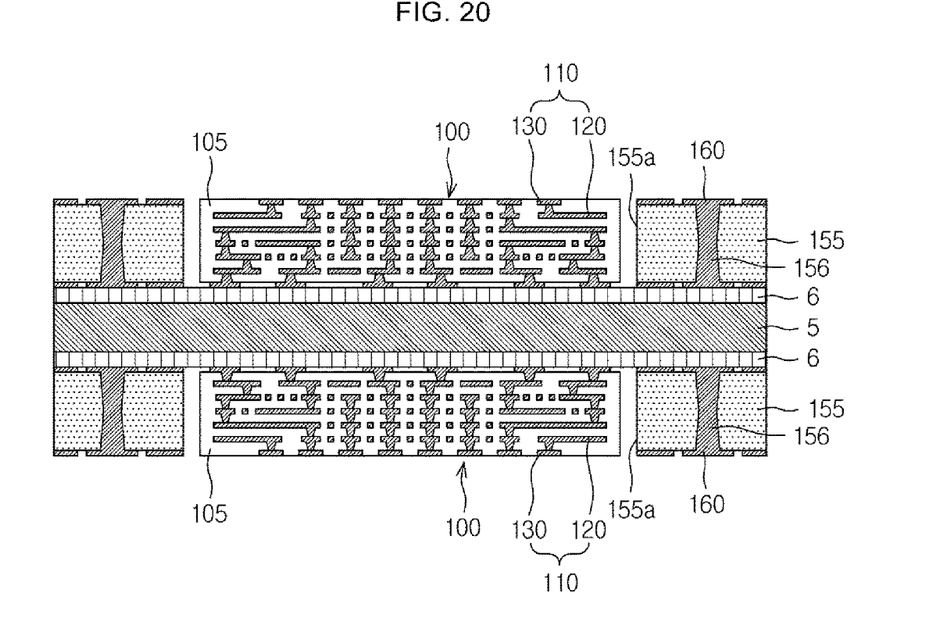

Referring to FIG. 20, the sub-circuit board 100 having the high density circuit 110 provided therein is prepared, and the sub-circuit board 100 is positioned inside the through-hole C. The sub-circuit board 100 is disposed in such a way that the sub-circuit board 100 is inverted. In other words, one surface of the sub-circuit board 100 to which the die 1 is to be connected is oriented toward the carrier 5.

Figure 21:
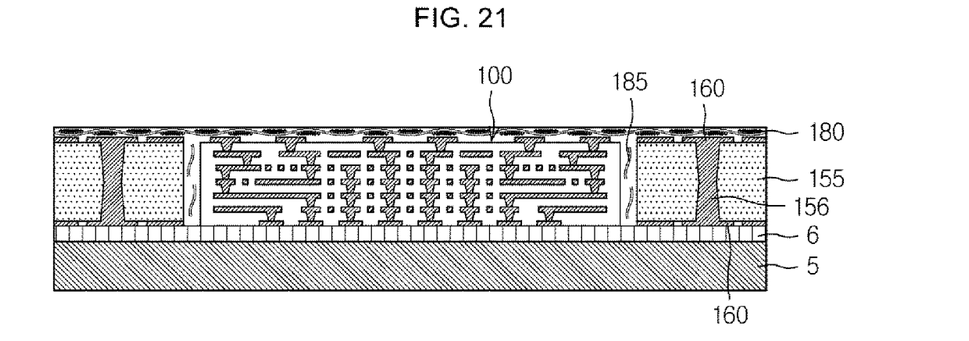

Referring to FIG. 21, the first insulating layer 180 is laminated or otherwise applied on the other surface of the core member 155, and the sub-circuit board 100 is encapsulated by filling an insulating material 185 in the gap between the sub-circuit board 100 and the core board 155 (that is, the gap between the inner wall 155a of the through-hole C and the sub-circuit board 100). The first insulating layer 180 containing fabric stiffener is laminated on the sub-circuit board 100 and the core member 155 to couple the sub-circuit board 100 to the core member 155 more tightly.

Figure 22:
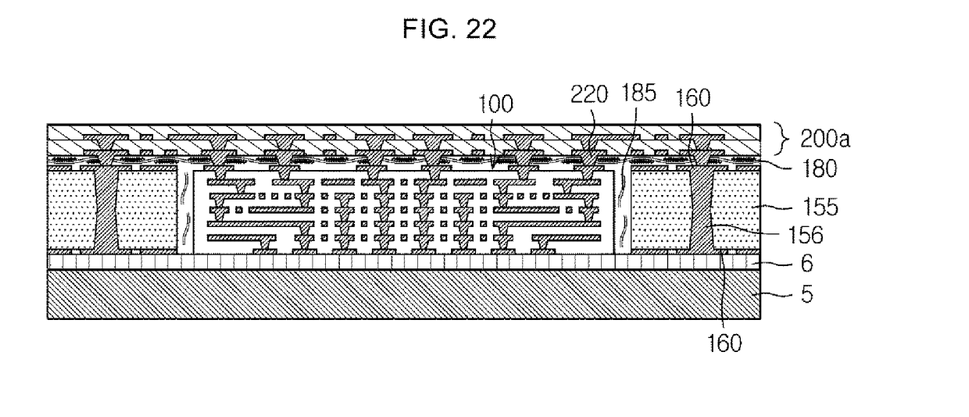

Referring to FIG. 22, the multiple low density circuit layers 200a are formed on two upper substrates formed on either surface of the carrier 5. For example, the via 220 connected with the low density circuit layers 200a and the high density circuit 110 is formed on the other surface of the sub-circuit board 100. The insulating layer 180 including a fabric stiffener is applied to the multiple low density circuit layers 200a, between the low density circuit layers 200a and the core member 155, in order to prevent warpage.

Figure 23:
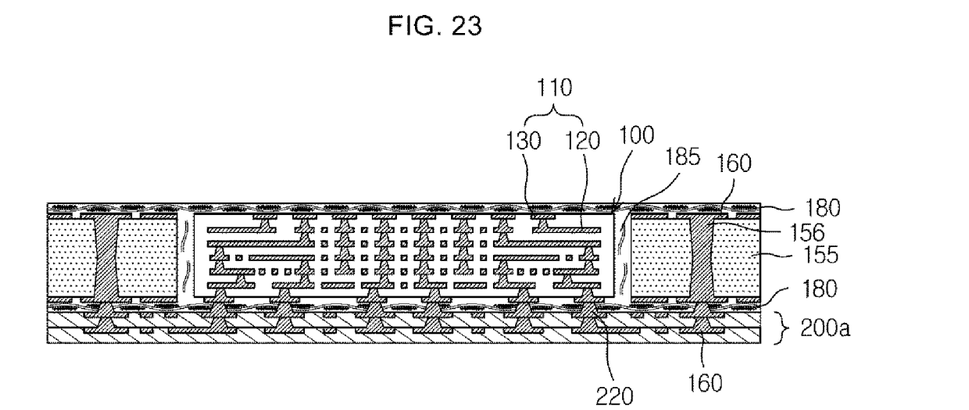
Figure 24:
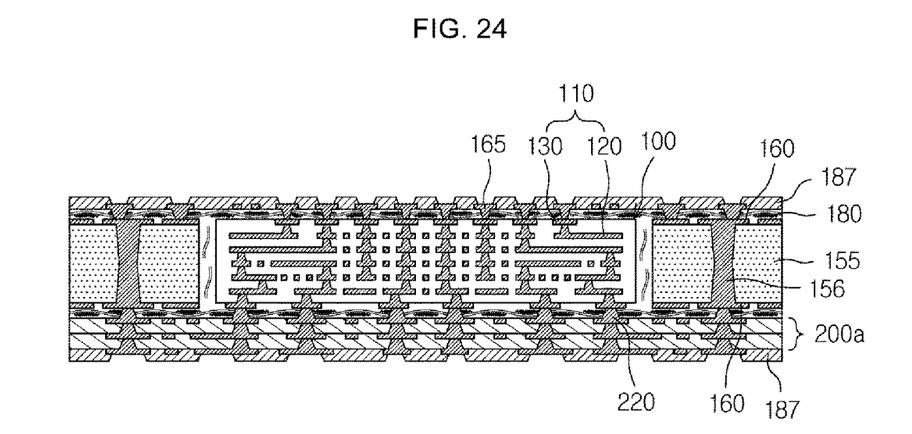

Referring to FIG. 23 and FIG. 24, the outer layer circuit 165 connected with one surface of the sub-circuit board 100 is formed after separating the carrier 5 from the core member 155. A solder resist layer 187 is formed on an outer layer of the printed circuit board 10b.

Figure 25:
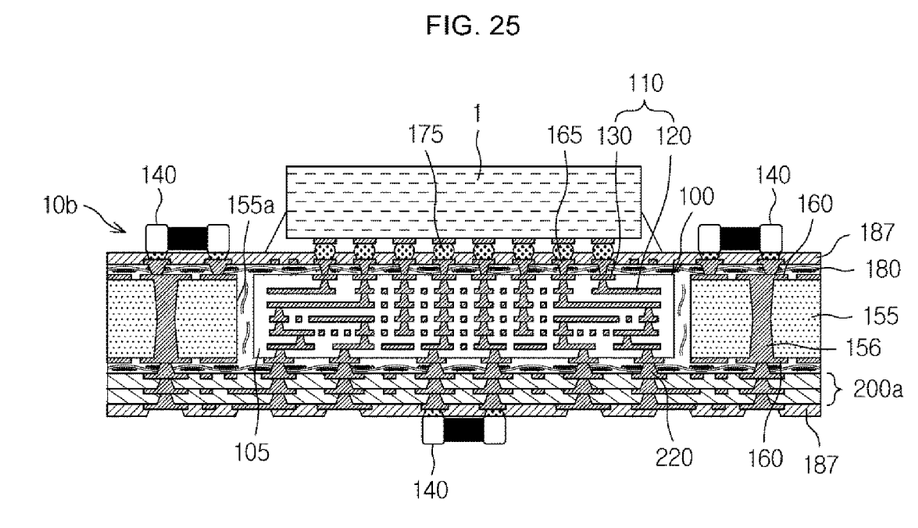

Referring to FIG. 25, the die 1 is installed using the solder bump 175 on the outer layer circuit 165 exposed at one surface of the printed circuit board 10b through an opening of the solder resist layer 187, and the first electronic device 140 may be installed on the other surface of the printed circuit board.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:
1. A printed circuit board, comprising:
a core member comprising a through-hole;
a sub-circuit board disposed in the through-hole;
a first insulating layer disposed on the core member and the sub-circuit board;
an outer circuit layer disposed on the first insulating layer, and comprising first circuit patterns having a first pitch and disposed to overlap the core member in a thickness direction, and second circuit patterns having a second pitch and disposed to overlap the sub-circuit board in the thickness direction;

an electronic device electrically connected to the outer circuit layer; and a die electrically connected to the outer circuit layer, wherein the first pitch is larger than the second pitch, and wherein the die and the electronic device are disposed on opposing surfaces of the printed circuit board, and the die, the sub-circuit board, and the electronic device overlap each other in the thickness direction.

2. The printed circuit board of claim 1, wherein the first and second circuit patterns are disposed on a same level.

3. The printed circuit board of claim 1, wherein the sub-circuit board comprises an inner circuit layer and a second insulating layer.

4. The printed circuit board of claim 3, further comprising an insulating material disposed between an inner wall of the through hole and the sub-circuit board, wherein the insulating material is made of a material different from a material of the second insulating layer.

5. The printed circuit board of claim 4, wherein the insulating material is filled with a material of the first insulating layer.

6. The printed circuit board of claim 1, wherein the first insulating layer further comprises a fabric stiffener.

7. The printed circuit board of claim 1, wherein the sub-circuit board comprises a coreless structure.

8. The printed circuit board of claim 1, wherein the sub-circuit board comprises a reinforcing layer comprising a fabric stiffener.

9. The printed circuit board of claim 1, wherein the sub-circuit board comprises an inner circuit layer comprising a high density circuit, and the outer circuit layer comprises a low density circuit having a density lower than a density of the high density circuit.

10. The printed circuit board of claim 9, wherein the high density circuit comprises stacked vias arranged symmetrically with one another.

11. The printed circuit board of claim 9, further comprising a via or a solder bump connecting the low density circuit with the high density circuit.

12. The printed circuit board of claim 9, wherein a width of the high density circuit is narrower than a width of the low density circuit.

13. The printed circuit board of claim 9, wherein the electronic device is electrically connected to the high density circuit.

14. The printed circuit board of claim 9, further comprising:

a solder resist layer disposed on the first insulating layer and having an opening exposing a portion of the low density circuit from the solder resist layer, wherein the die is disposed on the solder resist layer and connected to the exposed portion of the low density circuit, and wherein the die is electrically connected to the high density circuit through the low density circuit.

15. The printed circuit board of claim 1, wherein the first insulating layer is laminated on opposing surfaces of the core member and opposing surfaces of the sub-circuit board.

16. A printed circuit board, comprising:

a first circuit board comprising a first circuit;

a second circuit board embedded in the first circuit board between insulators, and comprising a second circuit electrically connected to the first circuit and having a circuit pattern density that is higher than a circuit pattern density of the first circuit;

an electronic device electrically connected to the first circuit; and a die disposed on the first circuit board and electrically connected to the first circuit, wherein the first circuit comprises first circuit patterns having a first pitch, and second circuit patterns having a second pitch and disposed between the first circuit patterns to overlap the second circuit board in a thickness direction, wherein the first pitch is larger than the second pitch, and wherein the die and the electronic device are disposed on opposing surfaces of the first circuit board, and the die, the second circuit board, and the electronic device overlap each other in the thickness direction.

17. The printed circuit board of claim 16, wherein the insulators comprise:

a laminated insulating layer disposed on the opposing surfaces of the first circuit board and opposing surfaces of the second circuit board; and an insulating material disposed between the first circuit board and the second circuit board.

18. The printed circuit board of claim 16, wherein the second circuit comprises a circuit layer disposed in a coreless insulating material.

* * * * *